United States Patent Office 3,718,503

Patented Feb. 27, 1973

3,718,503

METHOD OF FORMING A DIFFUSION MASK BARRIER ON A SILICON SUBSTRATE

William B. Glendinning, Belford, and Wellington B. Pharo, Neptune, N.J., assignors to the United States of America as represented by the Secretary of the Army No Drawing. Continuation-in-part of application Ser. No. 124,915, Mar. 16, 1971. This application July 14, 1971, Ser. No. 162,688

Int. Cl. B44d *1/18, 1/02;* C23f *13/00*

U.S. Cl. 117—212 5 Claims

ABSTRACT OF THE DISCLOSURE

The top surface of a silicon substrate having a particular impurity profile is exposed to a chemical vapor environment of nitric oxide, hydrogen fluoride and water at about 35 degrees C., and for about 3 to 5 minutes. Simultaneously with the exposure to the above-described vapor mixture, an image is projected onto the top surface of the silicon substrate during the entire time interval of vapor exposure. For completion of device fabrication, dopant atoms are then diffused into the silicon surface where the image has been projected.

This invention relates in general to a method of treating a silicon substrate having a particular impurity profile and in particular to a method of forming a silicon device.

BACKGROUND OF THE INVENTION

This application is a continuation-in-part of U.S. Patent application Ser. No. 124,915 of William B. Glendinning and Wellington B. Pharo for "Method of Forming a Diffusion Mask Barrier on a Silicon Substrate," filed Mar. 16, 1971 and assigned to the U.S. Government. In that application, a method of treating a silicon substrate having a particular impurity profile is disclosed and claimed in which strict process controls are maintained by the use of low temperatures and a particular vapor atmosphere to form a diffusion mask barrier on the top surface of the silicon substrate. The difficulty with the S.N. 124,915 method is that the fabrication of a silicon device from the treated silicon substrate still requires the use of expensive and time consuming photolithographic and etch techniques.

SUMMARY OF THE INVENTION

The general object of this invention is to provide a method of fabricating a silicon device from a silicon substrate having a particular impurity profile without using conventional photolithographic and etch techniques. A further object of this invention is to provide such a method that will result in silicon devices such as diodes and/or transistors characterized by adequate electrical characteristics.

According to the invention, the top surface of a silicon substrate having a particular impurity profile such as a p, $p^+$, n or $n^+$ type conductivity, or combinations thereof, is exposed to a chemical vapor environment of nitric oxide, hydrogen fluoride, and water in a closed chamber at about 35 degrees C., and for about 3 to 5 minutes. Simultaneously with the exposure to the above-described vapor mixture, an image is projected onto the top surface of the silicon substrate during the entire time interval of vapor exposure. For completion of device fabrication, dopant atoms are then diffused into the silicon surface where the image has been projected.

BRIEF DESCRIPTION OF THE PREFERRED EMBODIMENT

A $p^+$ type silicon wafer with a p type epitaxial layer or impurity profile is placed in a suitable closed chamber purged with an inert gas such as argon. The wafer is then exposed to a chemical vapor pressure environment of 1 atmosphere consisting of about 30 to 60 millimeters mercury of nitric oxide, 8 to 10 millimeters mercury of hydrogen fluoride, and 3 to 4 millimeters mercury of water and inert carrier gas (argon) for about 3 to 5 minutes at about 35 degrees C. ($\pm 1$ degree C.). This processing results in an adhering complex oxide film of about 1000 to 3000 angstroms in thickness. Simultaneously, with the exposure to the above-described vapor mixture an image is projected onto the silicon surface. The image can be conveniently formed by conventional projection means located external to and above the closed chamber. Such projection means include for example an incandescent tungsten source at about 3100 degrees K., a condensing lens, an image forming mask, and a low power sapphire projection lens. The surface intensity of illumination from the incandescent tungsten source is about 800 to 2000 ergs per square centimeter. No film growth occurs on the silicon surface where the image has been projected. The projected image is applied during the entire time interval of vapor exposure.

For completion of device fabrication, dopant atoms can now be diffused directly into the film free surface area of the silicon substrate; that is, the area of the silicon surface where the image has been projected. No dopant diffusion occurs through areas protected by the complex oxide film. For example, in the above embodiment, an N-type diffused layer can be placed in the p type epitaxial layer by sublimation of a phosphorus pentoxide source in a slightly oxidizing nitrogen stream. The phosphorus impurity diffuses into the film free surface area of the silicon substrate upon exposure at temperatures of 900 degrees C. In less than an hour, an erfc type impurity diffusion is created in the silicon having an impurity surface concentration of greater than ($10^{19}$) atom per $cm.^3$. An NP junction is thus placed at depths below the silicon surface ranging to 0.7 micron. Inversion of the silicon surface at locations beneath the mask does not occur at all. Conventional device finishing methods may be applied to provide electrical contacts to the N and P regions of the diffused diodes. For monolithic silicon integrated circuit applications, interconnections may be made across the mask film material which acts as an excellent electrical insulator.

The invention is simple in the type of equipment and materials required. That is, the silicon wafer or substrate is placed on an inert Teflon type base or other suitable mounting in the closed chamber so that the top surface of the wafer is exposed to the chemical vapor environment and to the image projection means. The image projection means is located above the closed chamber. Its particular distance from the top surface of the silicon substrate is not critical. All that is required is that it provide a surface intensity of illumination of at least 800 ergs per $cm^2$. The time required for exposure is about 3 to 5 minutes. The temperature during exposure is maintained at 35 degrees C. $\pm 1$ degree C. The low temperature of growth reduces the mechanical strain effects due to complex oxide film or diffusion mask silicon thermal coefficient of expansion differences. The short diffusion mask fabrication time is about one fifth the time required for fabricating a diffusion mask by the conventional high temperature thermal oxidation technique. Moreover, the mechanical stress of the diffusion mask barrier is reduced from 50,000 pounds per square inch as in the case of the barrier as made by conventional high temperature thermal oxidation to 20,000 pounds per square inch in the case of the barrier or film made by the low temperature method of this invention. Moreover, this low temperature method completely eliminates the impurity atom diffusion effects inherent in conventional oxide or other elevated temperature fabrication methods. Then too, the method of this invention enables the use of simple film growth process apparatus. In this connection, conventional high temperature thermal oxide apparatus costs about $5,000 as compared to the apparatus used in the instant invention which is about $2,000.

We wish it to be understood that we do not desire to be limited to the exact details of construction shown and described, for obvious modifications will occur to a person skilled in the art.

What is claimed is:

1. Method of treating a silicon substrate having a particular impurity profile, said method comprising exposing the top surface of the silicon substrate in a closed chamber at about 35 degrees C., and for about 3 to 5 minutes to a chemical vapor environment of nitric oxide, hydrogen fluoride, and water, and projecting an image onto the top surface of the silicon substrate by projection means located external to and above the closed chamber during the entire time interval of vapor exposure.

2. The method according to claim 1 wherein the chemical vapor environment is about 30 to 60 millimeters mercury of nitric oxide, about 8 to 10 millimeters mercury of hydrogen fluoride, about 3 to 4 millimeters mercury of water, and up to 1 atmosphere of inert gas.

3. Method of treating a silicon substrate having a particular impurity profile, said method comprising exposing the top surface of the silicon substrate in a closed chamber at about 35 degrees C., and for about 3 to 5 minutes to a chemical vapor environment of nitric oxide, hydrogen fluoride, and water, and projecting an image onto the top surface of the silicon substrate from an incandescent tungsten source at about 3100 degrees K. to give a surface intensity of illumination of about 800 to 2000 ergs per square centimeter during the entire time interval of vapor exposure.

4. Method of treating a silicon substrate having a particular impurity profile, said method comprising exposing the top surface of the silicon substrate in a closed chamber at about 35 degrees C., and for about 3 to 5 minutes to a chemical vapor environment of about 30 to 60 millimeters mercury of nitric oxide, about 8 to 10 millimeters mercury of hydrogen fluoride, about 3 to 4 millimeters mercury of water, and up to 1 atmosphere of inert gas; and projecting an image onto the top surface of the silicon substrate from an incandescent tungsten source at about 3100 degrees K. to give a surface intensity of illumination of about 800 to 2000 ergs per square centimeter during the entire time interval of vapor exposure.

5. Method of forming a silicon device comprising exposing the top surface of a silicon substrate having a particular impurity profile in a closed chamber at about 35 degrees C., and for about 3 to 5 minutes to a chemical vapor environment of nitric oxide, hydrogen fluoride and water; and projecting an image onto the top surface of the silicon substrate by projection means located external to and above the closed chamber during the entire time interval of vapor exposure; and then diffusing dopant atoms into the silicon surface where the image has been projected.

References Cited

UNITED STATES PATENTS

| | | | |
|---|---|---|---|
| 3,287,162 | 11/1966 | Chu et al. | 117—230 |
| 3,396,052 | 8/1968 | Rand et al. | 117—201 |
| 3,401,055 | 9/1968 | Langdon et al. | 117—212 |
| 3,625,749 | 12/1971 | Yoshioka et al. | 117—201 |
| 3,442,700 | 5/1969 | Yoshioka et al. | 117—201 |

ALFRED L. LEAVITT, Primary Examiner

K. P. GLYNN, Assistant Examiner

U.S. Cl. X.R.

117—93.3, 106 R, 201; 148—174